United States Patent
Kang

(10) Patent No.: US 6,509,787 B1
(45) Date of Patent: Jan. 21, 2003

(54) REFERENCE LEVEL GENERATOR AND MEMORY DEVICE USING THE SAME

(75) Inventor: Hee Bok Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/620,602

(22) Filed: Jul. 20, 2000

(30) Foreign Application Priority Data

Jul. 21, 1999 (KR) .............................. 99-29645

(51) Int. Cl.[7] .............................. G05F 1/10; G05F 3/02
(52) U.S. Cl. .......................................... 327/541; 327/53
(58) Field of Search .............................. 327/52, 53, 54, 327/56, 78, 87, 88, 89, 73, 541, 543, 540

(56) References Cited

U.S. PATENT DOCUMENTS

| | | | |
|---|---|---|---|
| 4,873,664 A | 10/1989 | Eaton, Jr. ................... 365/145 |
| 5,077,518 A | * 12/1991 | Han .......................... 323/275 |
| 5,627,493 A | * 5/1997 | Takeuchi et al. ............ 327/407 |
| 5,936,455 A | * 8/1999 | Kobayashi et al. .......... 327/541 |
| 5,982,226 A | * 11/1999 | Rincon-Mora ............... 323/273 |
| 6,194,887 B1 | * 2/2001 | Tsukada ..................... 323/315 |

* cited by examiner

Primary Examiner—Terry D. Cunningham
Assistant Examiner—Quan Tra
(74) Attorney, Agent, or Firm—Fleshner & Kim, LLP

(57) ABSTRACT

Reference level generating circuit in a memory device includes a first amplifier and a second amplifier each for comparing and amplifying a reference bitline level and a fedback preliminary reference level. A reference level adjuster receives signals from the first and second amplifiers, adjusts the signals to desired reference levels, and feeds the signals back to the first and second amplifiers. A reference level stabilizer stabilizes a reference level from the reference level adjuster, and a pull-down circuit drops an output from the reference level stabilizer by a required level in bitline precharging. An operational controller controls operation of the first and second amplifiers, the reference level adjuster, the reference level stabilizer, and the pull-down circuit. The reference level generating circuit and devices using such circuit improves data sensing rate and device reliability.

26 Claims, 13 Drawing Sheets

Realted art

REFERENCE LEVEL GENERATOR AND MEMORY DEVICE USING THE SAME

BACKGROUND OF THE INVENTION

1. Field of the Invention

The present invention relates to a memory device, and more particularly, to a reference level generator in a memory device.

2. Background of the Related Art

A ferroelectric memory, i.e., an FRAM (Ferroelectric Random Access Memory), has in general a data processing speed similar to a DRAM dynamic Random Access Memory) which is used widely as a semiconductor memory. Because the FRAM can conserve data even if the power is turned off, much attention has been given to FRAM as a next generation memory. The FRAM, a memory having a structure similar to the DRAM, is provided with a capacitor of a ferroelectric material for utilizing a high residual polarization of the ferroelectric material. The residual polarization permits the conservation of a data even after removal of an electric field.

FIG. 1 illustrates a characteristic curve of a hysteresis loop of a general ferroelectric material. A polarization induced by an electric field is not erased, but a certain amount ('d' and 'a' states) remains, even if the electric field is removed owing to existence of the residual polarization (or spontaneous polarization). The 'd' and 'a' states correspond to '1' and '0', respectively, in application to memories.

FIG. 2 illustrates a system of unit cell of the related art non-volatile ferroelectric memory. The system of a unit cell of the related art non-volatile ferroelectric memory is provided with a bitline BL formed in one direction, a wordline W/L formed in a direction perpendicular to the bitline, a plateline P/L formed spaced from the wordline in a direction identical to the wordline, a transistor T1 having a gate connected to the wordline W/L and a source connected to the bitline BL, and a ferroelectric capacitor FC1 having a first terminal connected to a drain of the transistor T1 and a second terminal connected to the plateline P/L.

FIG. 3A illustrates a timing diagram of a write mode operation of the related art ferroelectric memory. In a writing mode, when an external chip enable signal CSBpad changes from 'high' to 'low' and a write enable signal WEBpad changes from 'high' to 'low' simultaneously, the write mode is enabled or initiated. When an address decoding is started in the write mode, a pulse applied to a relevant wordline is transited from 'low' to 'high' to select a cell. Thus, during a period the wordline is held 'high', a relevant plateline has a 'high' signal applied thereto for one period and a 'low' signal applied thereto for the other period in succession.

In order to write a logical value '1' or '0' on the selected cell, a 'high' or 'low' signal synchronized to the write enable signal WEBpad is applied to a relevant bitline. If a 'high' signal is applied to the bitline and a signal applied to the plateline is 'low' in a period in which a signal applied to the wordline is 'high', a logical value '1' is written on the ferroelectric capacitor. If a 'low' signal is applied to the bitline and a signal applied to the plateline is 'high', a logical value '0' is written on the ferroelectric capacitor.

The operation for reading the data stored in the cell by the aforementioned write mode operation will be explained.

FIG. 3B illustrates a timing diagram of a read mode operation of the related art ferroelectric memory. If the chip enable signal CSBpad changes from 'high' to 'low' from outside of the chip, all bitlines are equalized to a 'low' voltage before a relevant wordline is selected. After the bitlines are disabled, an address is decoded, and the decoded address causes a 'low' signal on a relevant wordline to transit to a 'high' signal, to select a relevant cell. A 'high.' signal is applied to the plateline of the selected cell, to break a data corresponding to a logical value '1' stored in the ferroelectric memory. If a logical value '0' is in storage in the ferroelectric memory, a data corresponding to the logical value '0' is not broken. As the data not broken and the data broken provide values different from each other according to the aforementioned hysteresis loop, the sense amplifier can sense a logical value '1' or '0'.

The case of the data broken is a case when the value is changed from 'd' to 'f' in the hysteresis loop of FIG. 1, and the case of the data not broken is a case when the value is changed from 'a' to 'f' in the hysteresis loop of FIG. 1. Therefore, if the sense amplifier is enabled after a certain time period has passed, in the case of the data broken, a logical value '1' is provided as amplified, and in the case of the data not broken, a logical value '0' is provided. After the sense amplifier provides the data and since an original data should be restored, the plateline is disabled from 'high' to 'low' in a state a 'high' signal is applied to a relevant wordline.

FIG. 4 illustrates a block diagram of a related art non-volatile ferroelectric memory. The related art nonvolatile ferroelectric memory is provided with a main cell array 41 having a lower portion allocated for a reference cell array 42, a wordline driver 43 on one side of the main cell array 41 for providing a driving signal to the main cell array 41 and the reference cell array 42, and a sense amplifier unit 44 formed under the main cell array 41. The wordline driver 43 provides a driving signal to the main wordline for the main cell array 41 and the reference wordline for the reference cell array 42. The sense amplifier unit 44 has a plurality of sense amplifiers each for amplifying bitlines and bitbarlines.

The operation of the aforementioned nonvolatile ferro-electric memory will be explained with reference to FIG. 5, which illustrates a partial detail of FIG. 4, wherein the main cell array has a folded bitline structure. The reference cell array 42 also has a folded bitline structure, and two pairs of a reference cell wordline and a reference cell plateline are provided, which are defined as RWL_1, RPL_1 and RWL_2, RPL_2 . . . RWL_N-1, PRL_N-1, and RWL_N, RPL_N, respectively.

Provided that the main cell wordline MWL_N-1 and the main cell plateline MPL_N-1 is enabled, the reference cell wordline RWL_N-1 and the reference cell plateline RPL_N-1 are enabled. Therefore, a data from the main cell is loaded on the bitline BL, and a data from the reference cell is loaded on the bitbarline /BL. When the main cell wordline MWL_N and the main cell plateline MPL N are enabled, the reference cell wordline RWL_N and the reference cell plateline RPL_N are also enabled. Therefore, a data from the main cell is loaded on the bitbarline /BL, and a data from the reference cell is loaded on the bitline BL. In this instance, a bitline level REF caused by the reference cell is between bitline levels B_H(High) and B_L (Low) caused by the main cell.

In order to position the reference voltage REF between the bitline levels B_H and B_L, two reference cell operation methods can be used. The first method stores logic "1" in the capacitor of the reference cell, which can be achieved by providing a capacitor of a reference cell of which size is smaller than a capacitor size of the main cell. The second method stores a logic "0" in the capacitor of the reference cell, which can achieved by providing a capacitor of a reference cell of which size is larger than a capacitor size of the main cell. Thus, the related art nonvolatile ferroelectric memory can produce a reference voltage required by the sense amplifier unit 44 by using the foregoing two methods.

However, the aforementioned related art nonvolatile ferroelectric memory has various problems. For example, when a capacitor size of the reference cell is made smaller than a capacitor size of the main cell as the first method for providing a level of the reference voltage to be between the bitline levels B_H and B_L, when the reference cell capacitor is excessively switched, i.e., destructed, in comparison to the main cell, the reference cell experiences fatigue before the main cell, which can lead to an unstable reference voltage. Further, when a capacitor size of the reference cell is made larger than a capacitor size of the main cell as the second method for providing a level of the reference voltage to be between the bitline levels B_H and B_L, although fatigue may not be a problem, the capacitor size increases, leading to an increase in size of the FRAM.

SUMMARY OF THE INVENTION

An object of the invention is to solve at least the above problems and/or disadvantages and to provide at least the advantages described hereinafter.

An object of the present invention is to provide a stable reference voltage.

Another object of the present invention is tor provide an improved data sensing reliability.

An object of the present invention and other advantages can be achieved in a whole or in parts by a reference level generating circuit for a memory device comprising: a first amplifier and a second amplifier, each for comparing and amplifying a reference bitline level and a fedback preliminary reference level; a reference level adjuster for receiving signals from the first and second amplifiers, adjusting the signals to desired reference levels, and feeding the signals back to the first and second amplifiers; and a reference level stabilizer for stabilizing a reference level from the reference level adjuster.

An object of the present invention and other advantages can be achieved in a whole or in parts by a reference level generating circuit in a nonvolatile ferroelectric memory includes a first amplifier and a second amplifier each for comparing and amplifying a reference bitline level and a fedback preliminary reference level, a reference level adjuster for receiving signals from the first and second amplifiers, adjusting the signals to desired reference levels, and feeding the signals back to the first and second amplifiers, a reference level stabilizer for stabilizing a reference level from the reference level adjuster, a pull-down circuit for dropping an output from the reference level stabilizer by a required level in bitline precharging, and an operation controller for controlling operation of the first and second amplifiers, the reference level adjuster, the reference level stabilizer, and the pull-down circuit.

An object of the present invention and other advantages can be achieved in a whole or in parts by a reference level generating circuit in a nonvolatile ferroelectric memory comprising: an operation controller including a first PMOS transistor for switching a power source voltage in response to a first control signal; a first amplifier including a second PMOS transistor having a source connected to an output terminal on the first PMOS transistor, and a gate and a drain connected in common, a third PMOS transistor connected in parallel with the second PMOS transistor with respect to an output terminal on the first PMOS transistor, a first NMOS transistor having a gate connected to a reference bitline and a source connected to the second PMOS transistor, a second NMOS transistor formed between a drain of the first NMOS transistor and a grounding terminal and controlled by a drain voltage of the second PMOS transistor, and a third NMOS transistor connected between the third PMOS transistor and the second NMOS transistor, for comparing and amplifying a signal from the reference bitline and a fedback signal; a second amplifier including a fourth PMOS transistor having a source connected to the output terminal on the operation controller, a fifth PMOS transistor connected in parallel with the fourth PMOS transistor with respect to the output terminal on the operation controller, a fourth NMOS transistor having a gate connected to the reference bitline and a source connected to a drain of the third PMOS transistor, a fifth NMOS transistor formed between a drain of the fourth NMOS transistor and a grounding terminal, and a sixth NMOS transistor formed between the fifth PMOS transistor and a drain of the fifth NMOS transistor, for comparing and amplifying a signal from the reference bitline and a fedback signal; a reference level adjuster including a seventh NMOS transistor formed between the output terminal on the operation controller and a gate of the third NMOS transistor and controlled by a drain voltage of the third PMOS transistor, an eighth NMOS transistor formed between a drain of the third PMOS transistor and a drain of the seventh NMOS transistor and controlled by a source voltage of the fourth NMOS transistor, a sixth PMOS transistor having a source connected to the output terminal on the operation controller and controlled by the first control signal, and a seventh PMOS transistor formed between the sixth PMOS transistor and a gate of the third NMOS transistor and controlled by a source voltage of the fourth NMOS transistor, for receiving a signal from the first and second amplifiers and adjusting to a desired level; a reference level stabilizer including a ninth NMOS transistor having a source connected to an output terminal on the reference level adjuster and controlled by a source voltage of the fourth NMOS transistor, a tenth NMOS transistor connected to the ninth NMOS transistor in series and controlled by a source voltage of the sixth NMOS transistor, and an eleventh NMOS transistor having a source connected to an output terminal on the reference level adjuster and a drain connected to a drain of the tenth NMOS transistor and controlled by an external second control signal, for stabilizing a reference level from the reference level adjuster; and a pull-down circuit including a twelfth NMOS transistor connected in parallel with a drain of the tenth NMOS transistor and controlled by the first control signal, and a thirteenth NMOS transistor formed between a drain of the twelfth NMOS transistor and a grounding terminal and having a gate and a drain connected in common, for dropping a reference level from the reference level stabilizer down to a threshold voltage level of an NMOS transistor in precharging the bitline.

An object of the present invention and other advantages can be achieved in a whole or in parts by a memory device comprising: a memory cell array having a main cell array of plurality of main memory cells and a reference cell array of a plurality of reference memory cells; a wordline driver that provides driving signals to select a corresponding number of main memory cells and reference memory cells; and a sense amplifier unit used for reading data from and writing data to the memory cell array, wherein the reference cell array is formed between the wordline driver and the main cell array.

An object of the present invention and other advantages can be achieved in a whole or in parts by a method of generating a reference voltage comprising: comparing and amplifying a reference bitline level and a feedback preliminary reference level in response to a switched voltage; adjusting the amplified bitline level and the feedback preliminary reference level; and stabilizing the feedback preliminary reference level.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
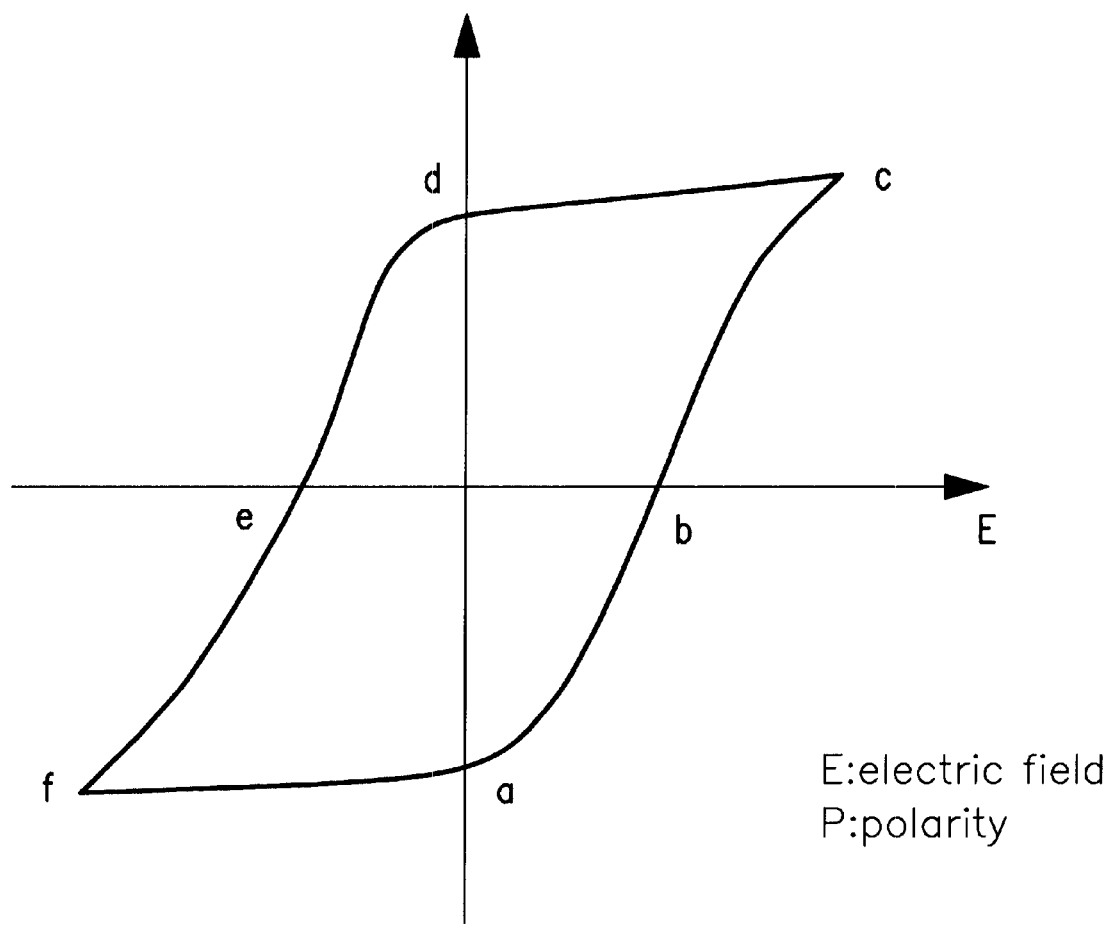
FIG. 1 illustrates a characteristic curve of a hysteresis loop of a general ferroelectric material.
Figure 2:
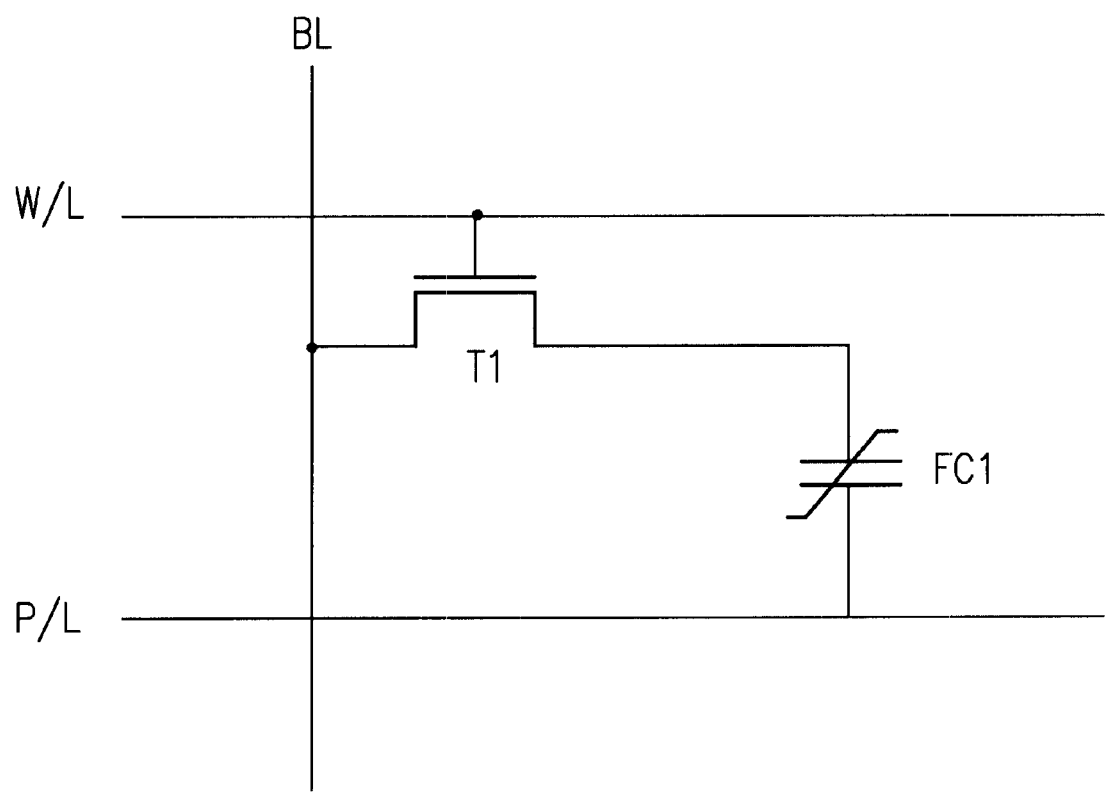
FIG. 2 illustrates a system of unit cell of a related art non-volatile ferroelectric memory.
Figure 3A:
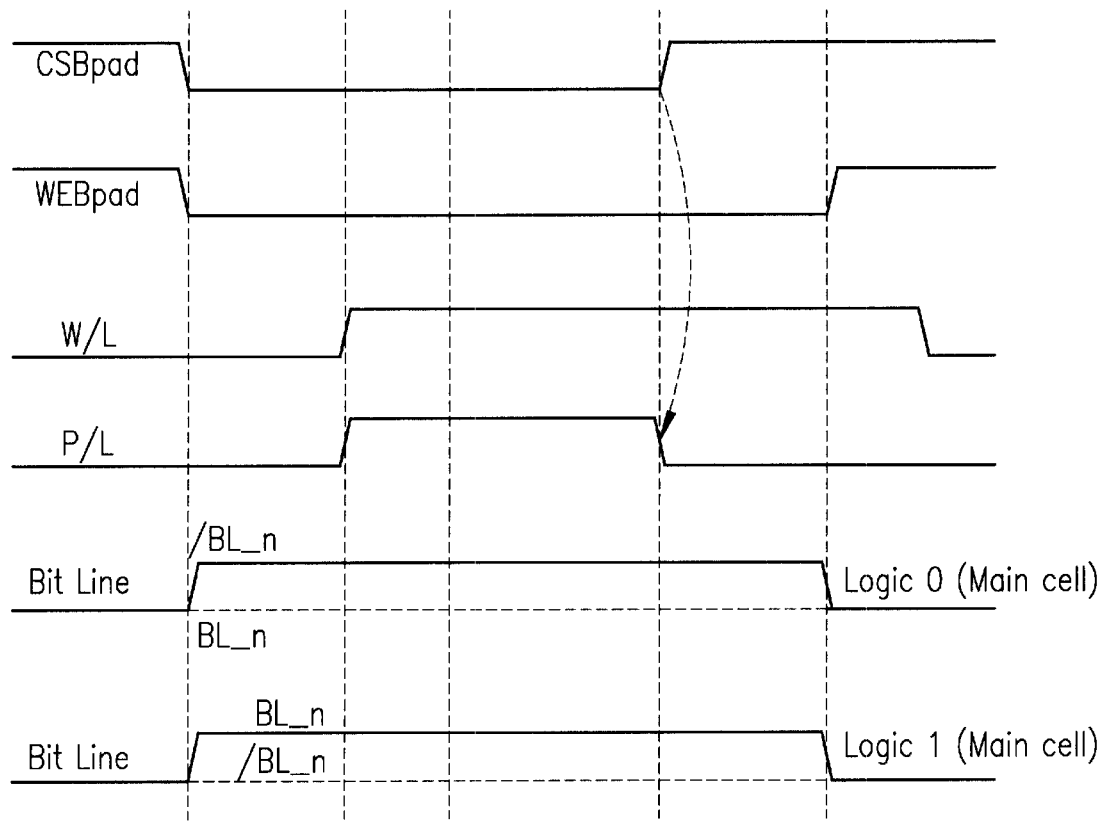
FIG. 3A illustrates a timing diagram of a write mode operation of the related art ferroelectric memory.
Figure 3B:
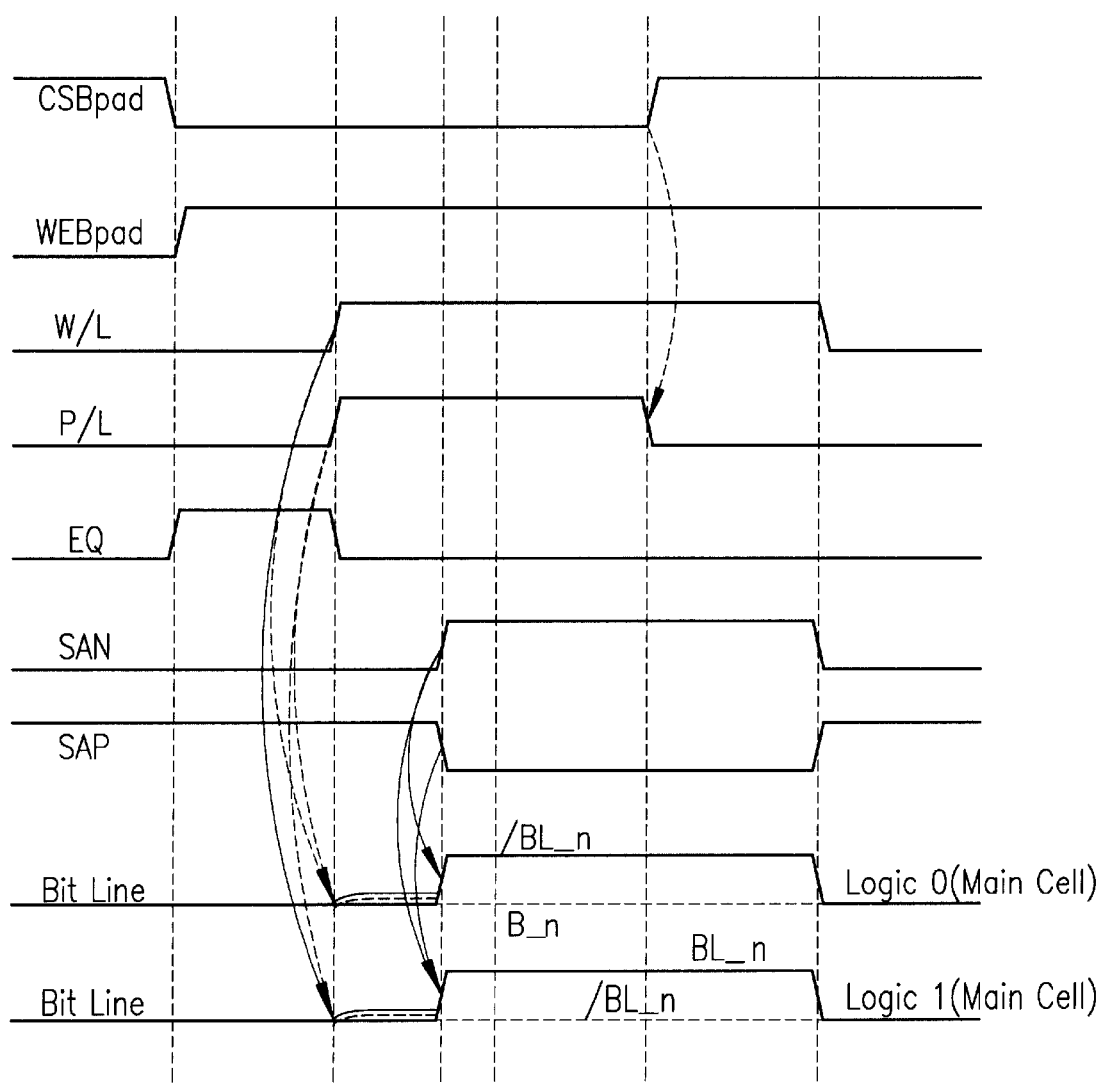
FIG. 3B illustrates a timing diagram of a read mode operation of the related art ferroelectric memory.
Figure 4:
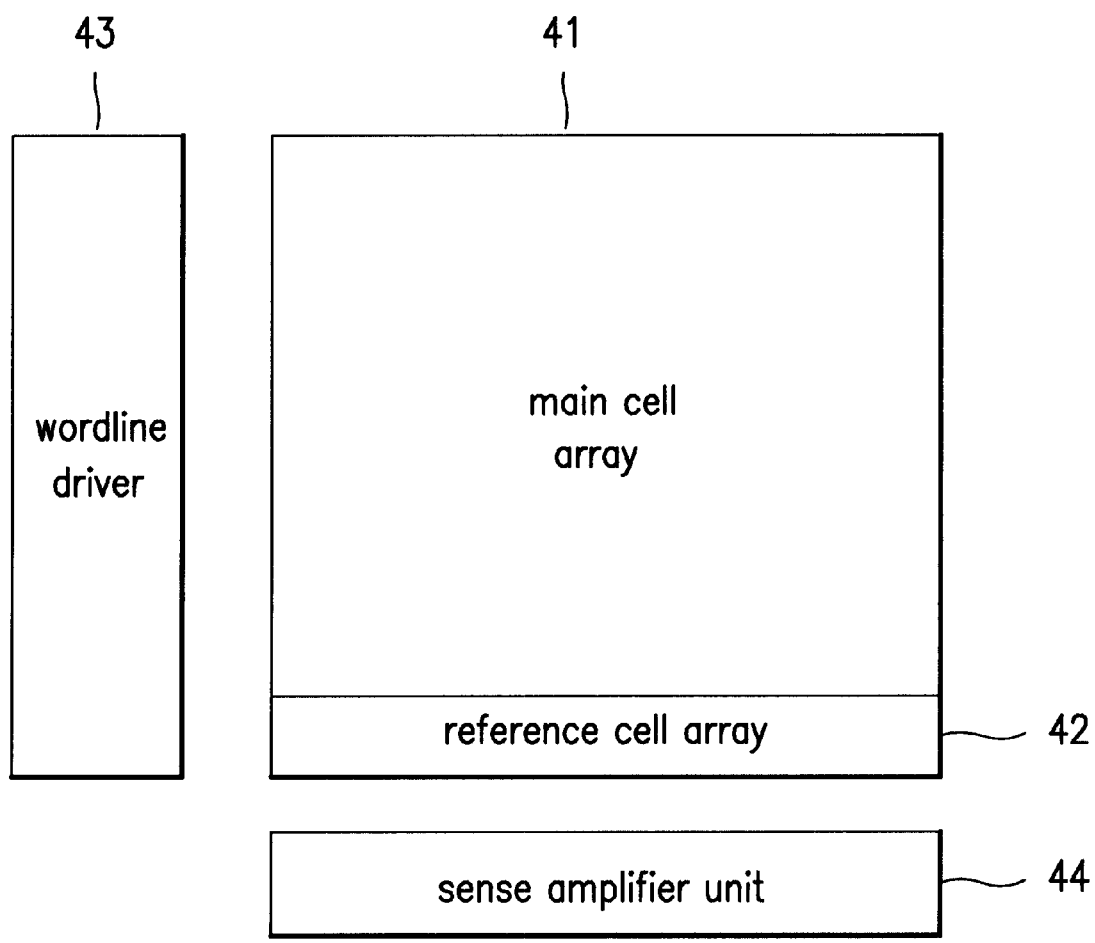
FIG. 4 illustrates a block diagram of a related art non-volatile ferroelectric memory.
Figure 5:
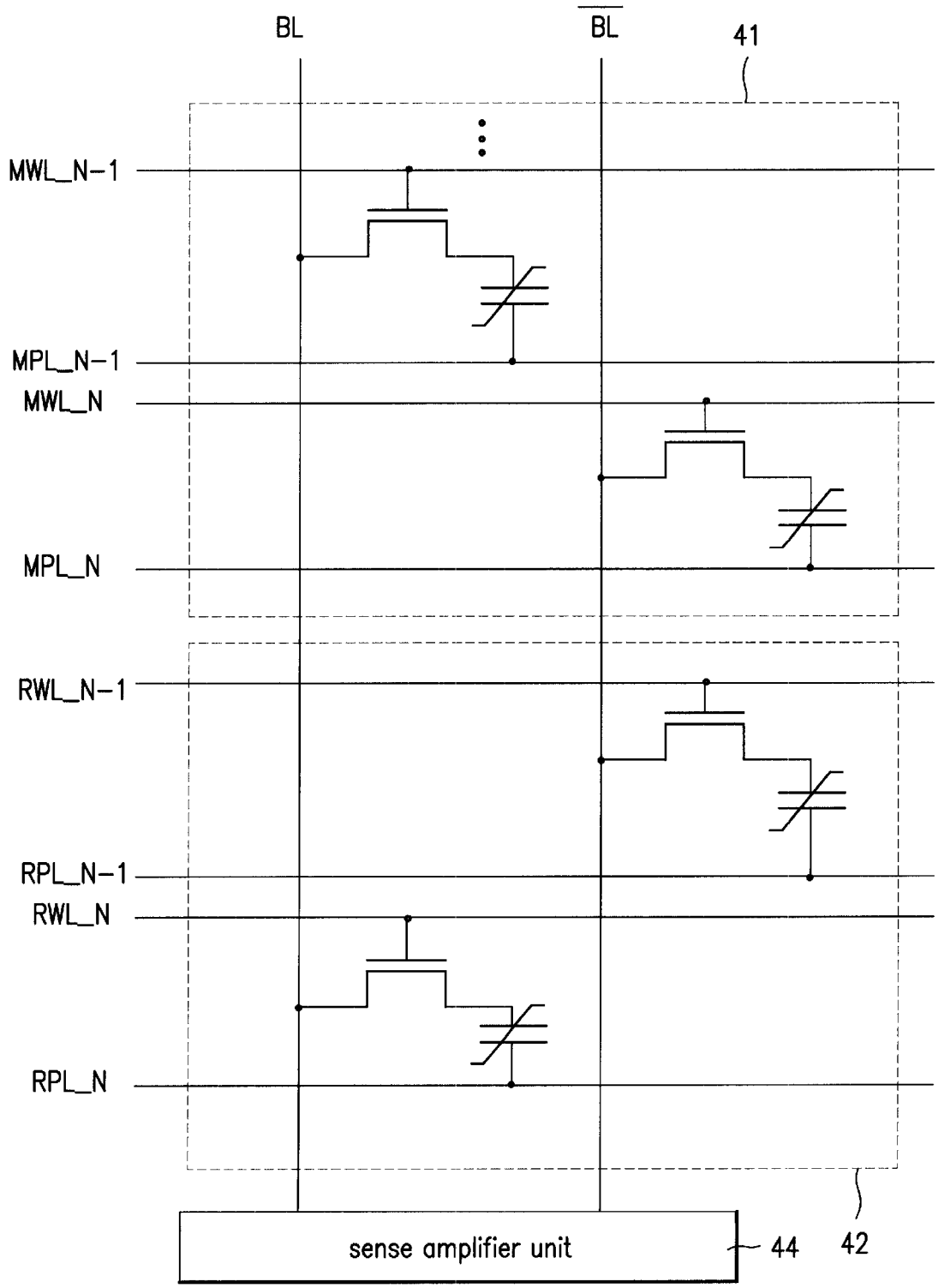
FIG. 5 illustrates a partial detail of FIG. 4.
Figure 6:
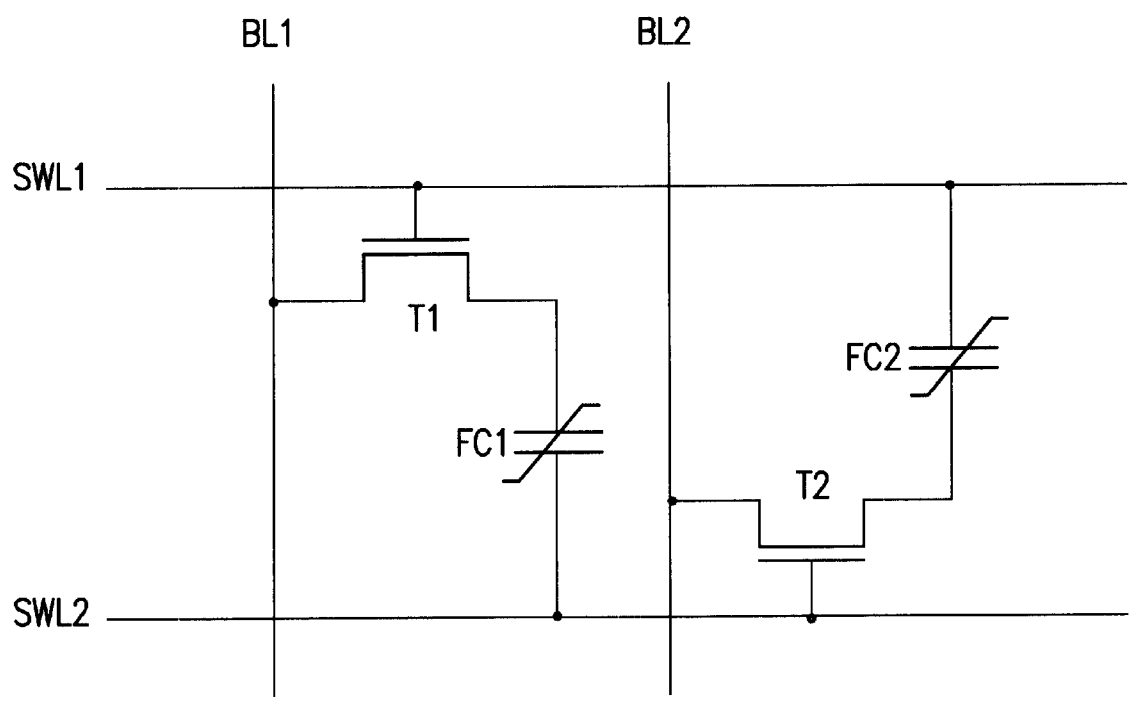
FIG. 6 illustrates a system of unit cell of a non-volatile ferroelectric memory in accordance with a preferred embodiment of the present invention.

FIG. 6 illustrates a system of unit cell of a non-volatile ferroelectric memory in accordance with a preferred embodiment of the present invention. The unit cell of a non-volatile ferroelectric memory in accordance with a preferred embodiment of the present invention includes a first split wordline SWL1 and a second split wordline SWL2 spaced a distance from each other formed in a first direction, preferably a row direction, a first bitline BL1 and a second bitline BL2 formed in a direction crossing the first and second split wordlines SWL1 and SWL2.

A first transistor T1 has a gate connected to the first split wordline SWL1 and a drain connected to the first bitline BL1, and a first ferroelectric capacitor FC1 is connected between a source of the first transistor T1 and a second split wordline SWL2. A second transistor T2 has a gate connected to the second split wordline SWL2 and a drain connected to the second bitline B2, and a second ferroelectric capacitor FC2 connected between a source of the second transistor T2 and the first split wordline SWL1. A plurality of the unit cells are formed to provide a cell array, wherein a unit cell has two transistors 2T and two ferroelectric capacitor 2C connected to one pair of split wordlines and two bitlines in view of structure.

Figure 7:
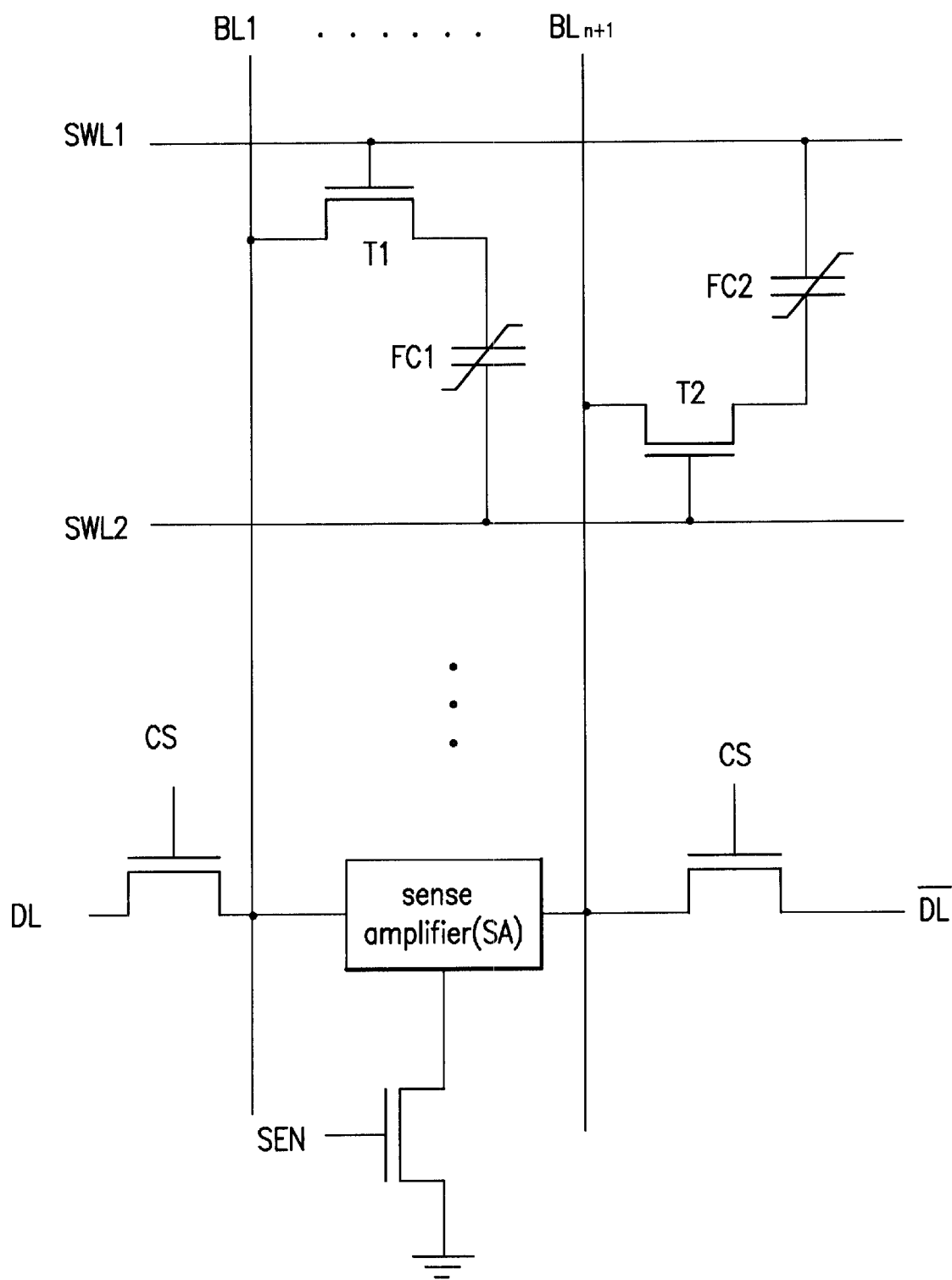
FIG. 7 illustrates a simplified circuitry system of a non-volatile ferroelectric memory of the present invention.

FIG. 7 illustrates a simplified circuitry system of a non-volatile ferroelectric memory in accordance with a preferred embodiment of the present invention. The non-volatile ferroelectric memory includes a plurality of split wordline pairs, the pair being a first and a second split wordlines SWL1 and SWL2, formed in a row direction, a plurality of bitlines BL1, BLn+1 formed in a direction crossing the split wordline pairs, and a sensing amplifiers SA, each disposed between the bitlines for sensing a data provided through both sides of bitlines and providing to a dataline DL or a databarline /DL. There may be a sensing amplifier enable unit for providing an enable signal SEN to enable the sense amplifiers, and a selection switching unit CS for selectively switching bitlines and datalines.

Figure 8:
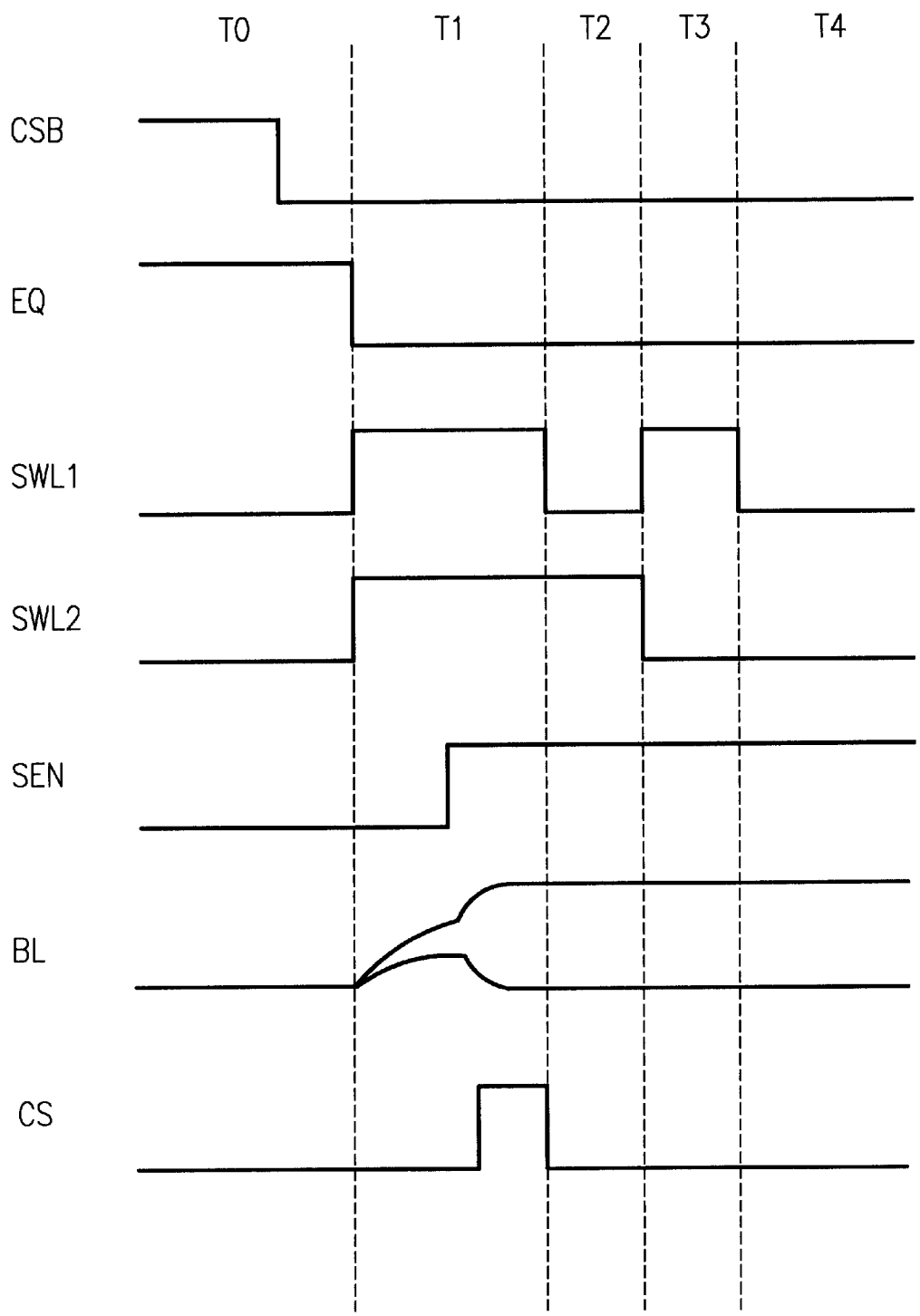
FIG. 8 illustrates a circuitry system of a non-volatile ferroelectric memory of the present invention provided for the purpose of explanation.

The operation of the nonvolatile ferroelectric memory of the present invention will be explained with reference to the timing diagram shown in FIG. 8. The time period T0 is a period before the first split wordline SWL1 and the second split wordline SWL2 are enabled to "H(High)", when all bitlines are precharged to a threshold voltage level of an NMOS transistor. The time period T1 is a period when both the first and second split wordlines SWL1 and SWL2 are transited to "H", and the data in the ferroelectric capacitor of the main cell is provided to the main bitline, to change a level of the bitline. In this instance, the ferroelectric capacitor having data stored in a logic "High" is involved in breakdown of the ferroelectric polarity due to application of electric fields of opposite polarities to the bitline and the split wordline, resulting in a great current to flow thereto to induce a high voltage to the bitline. Opposite to this, the ferroelectric capacitor having data stored in a logic "Low" is not involved in breakdown of the ferroelectric polarity as electric fields of the same polarity are applied to the bitline and the split wordline, resulting in a small current to flow thereto to induce a slightly lower voltage to the bitline.

If cell data are loaded on the bitline sufficiently, a sensing amplifier enable signal SEN is transited to "High" for enabling the sensing amplifier to amplify a level of the bitline. In the meantime, since the brokendown logic "H" data of the cell can not be restored under a state the first split wordline SWL1 and the second split wordline SWL2 are in "High", the data is restored in following time periods T2 and T3. In the time period T2, the first split wordline SWL1 is transited to low, the second split wordline SWL2 is held in a high state, and the second transistor T2 is in a turned on state. In this instance, if a relevant bitline is in a high state, a high data is provided to one side electrode of the second ferroelectric capacitor FC2, to restore a logic "1" state between a low state of the first split wordline SWL1 and a high level of the bitline. In the time period T3, the first split wordline SWL1 is transited to high again and the second split wordline SWL2 is transisted to low, to transit the first transistor T1 into a turned on state. In this instance, if a relevant bitline is in a high state, a high data will be provided to one side electrode of the first ferroelectric capacitor FC1, to restore the logic 1 state between the high levels of the second split wordline SWL2.

Figure 9:
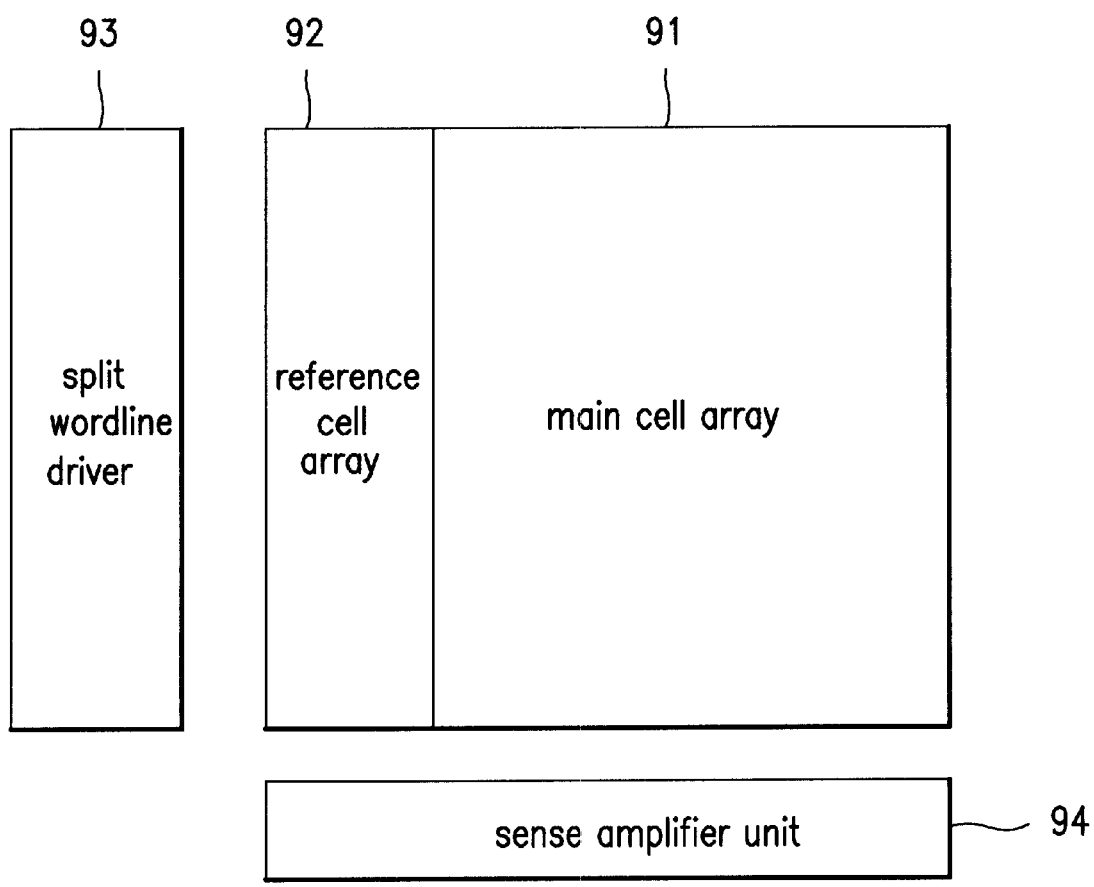
FIG. 9 illustrates a system of a non-volatile ferroelectric memory of the present invention.

A preferred embodiment of a reference level generating circuit for supplying a reference voltage to the sense amplifier in the aforementioned nonvolatile ferroelectric memory in accordance with will be explained. FIG. 9 illustrates a system of a non-volatile ferroelectric memory in accordance with a preferred embodiment of the present invention for explaining the reference level generating circuit in accordance with a preferred embodiment of the present invention.

Referring to FIG. 9, the non-volatile ferroelectric memory of the present invention includes a main cell array 91 having a reference cell array 92 allocated at either side thereof, a split wordline driver 93 for applying a driving signal to the main cell array 91, and a sensing amplifier unit 94 under (or over) the main cell array 91 having a plurality of sense amplifiers and reference voltage generators each for providing a reference voltage to the sense amplifier. An equalizing and precharging circuit is used for equalizing and precharging adjacent bitlines.

Figure 10:
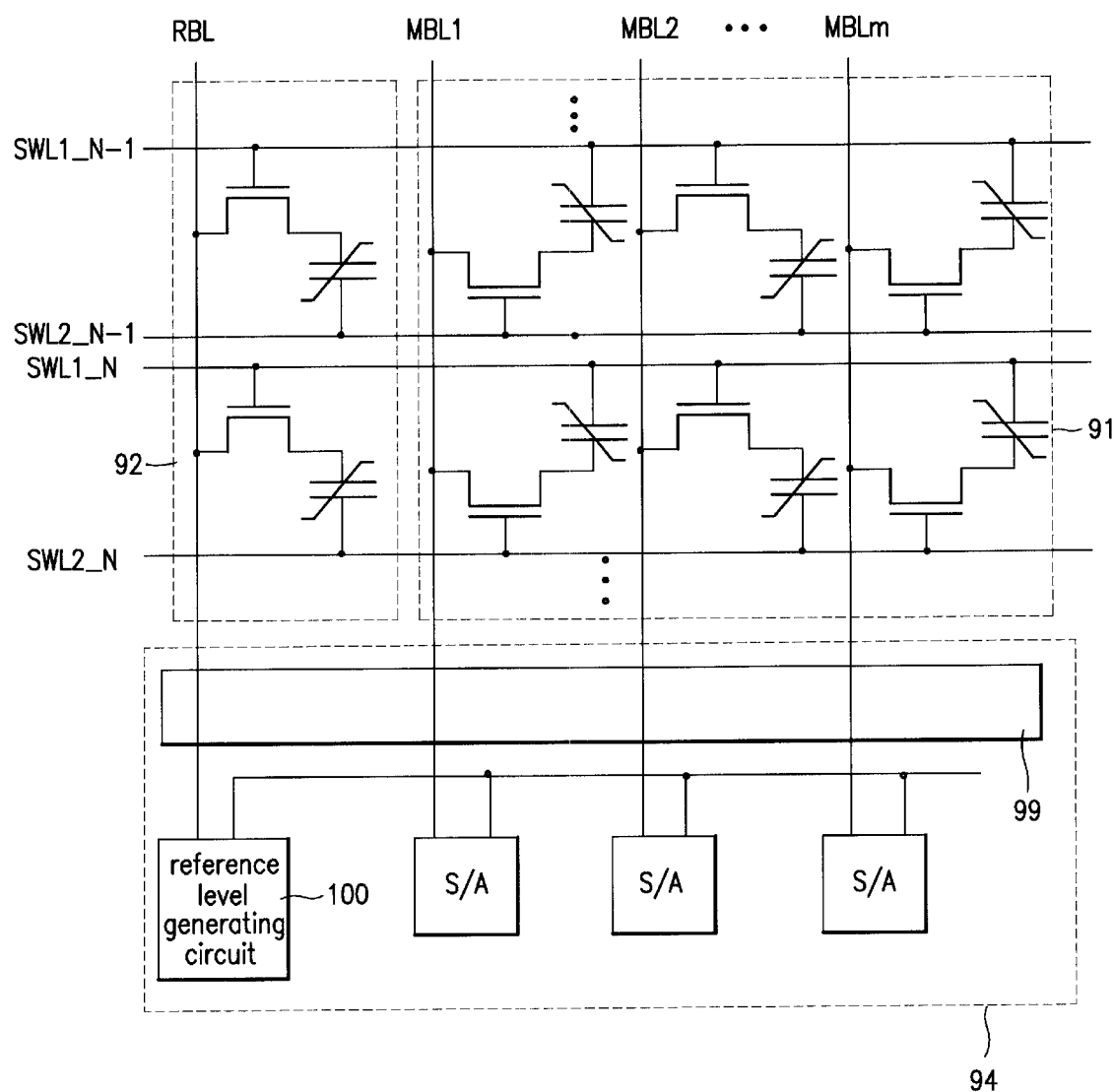
FIG. 10 illustrates a partial detail of FIG. 9.

FIG. 10 illustrates a partial detail of FIG. 9, showing a reference bitline RBL and a plurality of main bitlines MBL1, MBL2 . . . MBLm, running in a column direction, a plurality of split wordline pairs, one pair being the first split wordline SWL1 and the second split wordline SWL2, running in a direction crossing the reference bitline RBL and the main bitlines MBL1, MBL2 . . . MBLm cells each having a transistor and a ferroelectric capacitor formed between adjacent first and second split wordlines and two adjacent bitlines. An equalizing and precharging circuit 99 equalizes and precharges the bitlines, sensing amplifiers S/A, each connected to the main bitline senses data on the main bitline, and a reference level generating circuit 100 stabilizes a level of the reference voltage on the reference bitline and provides a reference voltage for the sense amplifiers.

In the aforementioned nonvolatile ferroelectric memory, when one pair of the split wordlines are enabled, the main cell and the reference cell are enabled. The data in the main cell is transferred to the main bitline, and therefrom to the sense amplifier, and the data in the reference cell is transferred to the reference bitline RBL. However, the data in the reference cell is not transferred to the sense amplifier directly through the reference bitline RBL. Instead, the data in the reference cell on the reference bitline RBL is provided to and amplified in the reference level generating circuit 100, and provided to the sense amplifier.

In such an instance, the data on the reference bitline RBL has a state identical to a logic "0" of the main bitline. In other words, the sizes of the main cell and the reference cell are almost the same, and the reference cell is to store a logic "0". Accordingly, the reference level generating circuit 100 senses a voltage on the reference bitline RBL and forwards the voltage boosted by ΔV, so that the boosted level is between a high and a low levels of the main bitline caused by the main cell. In, this instance, as the ferroelectric capacitor in the reference cell has no destruction operation exerted thereto, the ferroelectric capacitor is not involved in fatigue, and the level of the reference voltage can be stabilized because the same split wordline signals are received.

Figure 11:
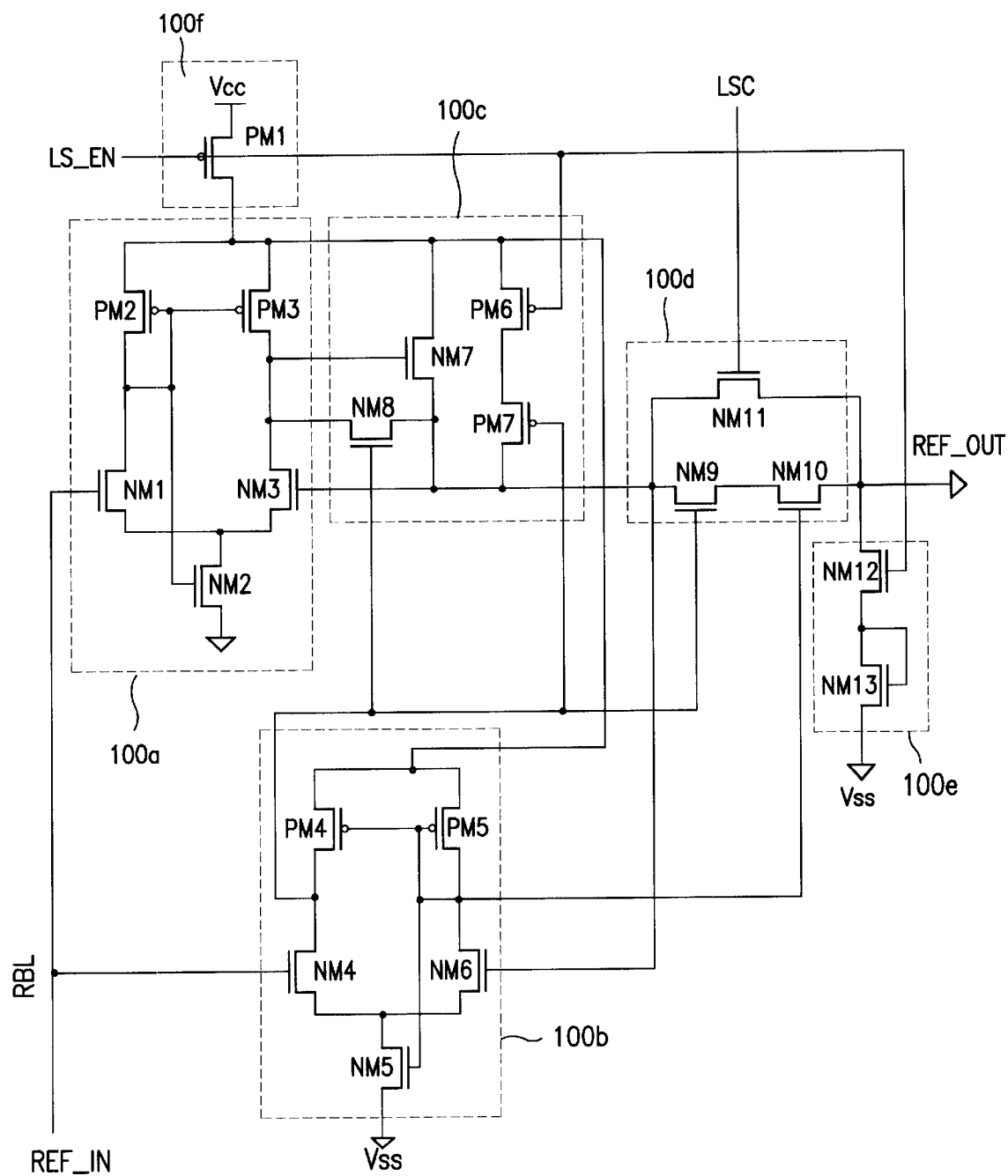
FIG. 11 illustrates a system of a reference level generating circuit in a non-volatile ferroelectric memory of the present invention.

FIG. 11 illustrates a system of a reference level generating circuit in a non-volatile ferroelectric memory in accordance with a preferred embodiment of the present invention. The reference level generating circuit includes a first amplifier 100a, a second amplifier 100b, a reference level adjuster 100c, a reference level stabilizer 100d, a pull-down circuit 100e, and an operational controller 100f for controlling the respective blocks. The operational controller 100f includes a PMOS transistor PM1 for selectively switching power source voltage in response to a first control signal LS_EN which is preferably provided externally.

The first amplifier 100a is a current mirror type differential amplifier. A first transistor PM2 has a source connected to an output terminal on the operational controller 100f and a gate and a drain connected in common, and a second transistor PM3 is connected in parallel with the first transistor PM2 with respect to the output terminal on the operation controller 100f. A third transistor NM1 has a gate connected to the reference bitline RBL and a source connected to a drain of the first transistor PM2, and a fourth transistor NM2 is provided between a drain of the third transistor NM1 and a grounding terminal and controlled by a drain voltage of the first transistor. A fifth transistor NM3 is disposed between the second transistor PM3 and the fourth transistor NM2 and controlled by a signal fed back from the reference level controller 100c. The first and second transistors PM2 and PM3 are PMOS transistors, and the third, fourth and fifth transistors NM1, NM2, and NM3 transistors are NMOS transistors.

The reference level adjuster 100c, disposed between an output terminal on the operation controller 100f and a gate of the fifth transistor NM3 in the first amplifier 100a, includes a first transistor NM7 controlled by a signal from the first amplifier 10b, and a second transistor NM8 controlled by a signal from the second amplifier 100b for adjusting an output of the first transistor NM7. A third transistor PM6 for switching an output of the operation controller 100f in response to an external control signal, and a fourth transistor PM7 controlled by a signal form the second amplifier 100b and formed between an output terminal of the third transistor PM6 and a gate of the fifth transistor NM3 in the first amplifier 100a. The first and second transistors NM7 and NM8 are NMOS transistors, and the third, and fourth transistors PM6 and PM7 are PMOS transistors.

The reference level stabilizer 100d controlled by a signal from the second amplifier 100b includes a first and a second transistors NM9 and NM10 connected to an output terminal on the reference level adjuster in series. A third transistor NM11 is controlled by an external second control signal LSC and has a source connected to an output terminal of the reference level adjuster 100c, and a drain connected to an output terminal on the second transistor NM10. The first, second, and third transistors NM9, NM10, and NM11 are NMOS transistors.

The pull-down circuit 100e includes a first transistor NM12 controlled by an external first control signal LS_EN and connected in parallel with an output terminal on the reference level stabilizer 100d. A second transistor NM13 is formed between a source of the first transistor and a grounding terminal and having a gate and a drain connected in common. The first and second transistors NM12 and NM13 are NMOS transistors.

The second amplifier 100b includes a first transistor NM4 having a gate connected to the reference bitline, a drain connected to a gate of the first transistor NM9 in the reference level stabilizer 100d. A second transistor PM4 is disposed between an output terminal on the operation controller 100f and a drain of the first transistor NM4, and a third transistor PM5 is connected in parallel with the second transistor PM4 with respect to the output terminal on the operation controller 100f. A fourth transistor NM5 is formed between a source of the first transistor NM4 and a grounding terminal Vss and having a gate connected to a gate of the third transistor PM5. A fifth transistor NM6 is formed between a drain of the third transistor PM5 and a drain of the fourth transistor NM5 and having a gate connected to an output terminal on the reference level adjuster 100c. The second, third transistors PM4 and PM5 are PMOS transistor, and the first, fourth, and fifth transistors NM4, NM5, and NM6 are NMOS transistors.

The operation of the reference level generating circuit in a nonvolatile ferroelectric memory in accordance with a preferred embodiment of the present invention having the aforementioned system will be explained. The reference level generating circuit of the present invention receives a signal from the reference bitline as a reference input REF_IN. In the control signal for the reference level generating circuit, there are a first control signal and a second control signal, wherein the first control signal is defined as LS_EN and the second control signal is defined as LSC. An output REF_OUT from the reference level generating circuit is used as a reference input to the plurality of sense amplifiers in the sense amplifier unit.

The LS_EN signal, the first control signal, either enables or disables the reference level generating circuit. If the LS_EN signal is high, the PMOS transistor in the operation controller 100f is disabled, to cut off a current flow from the power source Vcc to the grounding terminal. The LS_EN signal is high, the third transistor PM6 in the reference level adjuster 100c is turned off, and the first transistor NM12 in the pull-down circuit 100e is turned on. Therefore, an output REF OUT of the reference level generating circuit is discharged to the grounding terminal Vss through the second transistor NM13.

If the LS_EN, the first control signal, is low, the PMOS transistor in the operation controller 100f is enabled, to supply a power from the power source Vcc to the reference level generating circuit. The third transistor PM6 in the reference level adjuster 100c is turned on and the first transistor NM12 in the pull-down circuit 100e is turned off, cutting off discharge of the output REF_OUT from the reference level generating circuit to the grounding terminal through the second transistor NM13 in the pull-down circuit 100e. Once the reference voltage from the reference bitline RBL is provided to the gate of the third transistor NM1 in the first amplifier 100a and a gate of the first transistor NM4 in the second amplifier 100b, respective amplifiers for amplification. Another input to the first amplifier 100a and the second amplifier 100d, a fed back signal form the reference level adjuster 100c, is provided to the gate of the fifth transistor NM3 in the first amplifier 100a and the gate of the fifth transistor NM6 in the second amplifier 100b. An output from the first amplifier 100a and an output from the second amplifier 100b are provided to an input of the reference level adjuster 100 so that the outputs are adjusted to a desired reference level by the first and second transistors NM7 and NM8 and the third and fourth transistors PM6 and PM7 in the reference level adjuster 100c.

In this instance, the first amplifier 100a and the second amplifier 100b compare and amplify a signal fedback from the reference level adjuster 100c and a signal on the reference bitline, which is continued repetitively until a desired output of the reference level adjuster 100c is obtained. Provided that the desired reference level is obtained through the repetitive comparison and amplification operation, an output from the reference level adjuster 100c is provided to the reference level stabilizer 100d.

In the meantime, the first and second transistors NM9 and NM10 in the reference level stabilizer 100d provide an excellent effect in preventing unnecessary fluctuation of the reference level. In other words, the gates of the first and second transistors NM9 and NM10 in the reference level stabilizer 100d have a signal from the second amplifier 100b applied thereto. Therefore, since inputs to the first and second transistors NM9 and NM10 have phases opposite to each other, a transient response at the input terminal on the first transistor NM9 is offset with a transient response at an output terminal on the second transistor NM10 when the transient response at the input terminal on the first transistor NM9 is provided to the output terminal on the second transistor NM10, preventing a sudden change of the output REF_OUT of the reference level generating circuit. However, if the voltage provided to the gates of the first and second transistors NM9 and NM10 in the reference level stabilizer 100d are too low, the output from the reference level adjuster 100c may not be shown as the output REF OUT of the reference level generating circuit adequately, the third transistor NM11 is brought into a turned on state at a time when the transient response ends for providing a stable signal without loss as an output.

In order to provide a difference of $\Delta V$ between the input REF_IN to the reference level generating circuit and the output REF_OUT from the reference level generating circuit, the following method is used. Basically, sizes of the third transistor NM1 in the first amplifier 100a and the first transistor NM4 in the second amplifier 100b are made the same, and also sizes of the fifth transistor NM3 in the first amplifier 100a and the fifth transistor NM6 in the second amplifier 100b are made the same. Further, the driving powers of the fifth transistors NM3 and NM6 in the first and second amplifiers 100a and 100b are made smaller than driving powers of the third and first transistors NM3 and NM4 in the first and second amplifiers 100a and 100b. By adjusting sizes of the first, third, fourth transistors NM7, PM6 and PM7 in the reference level adjuster 100c, an output REF_OUT level of the reference level generating circuit can be elevated higher than an input level by $\Delta V$.

Figure 12:
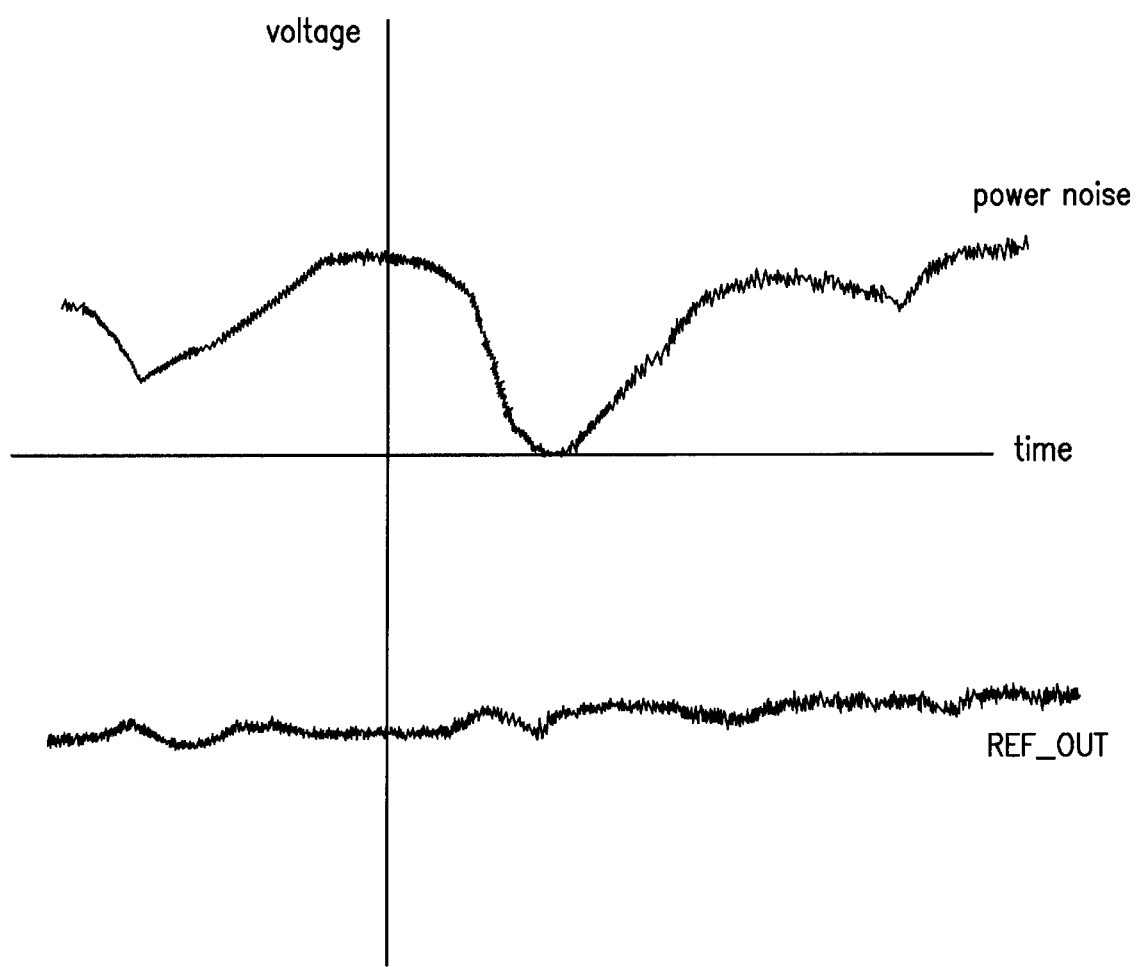
FIG. 12 illustrates noise from a power source voltage vs. output from a reference level generator.

FIG. 12 illustrates a noise from a power source voltage vs. an output from a reference level generator, wherefrom it can be known that the reference level generating circuit of the present invention can provide a stable reference level despite of the noise from the power source voltage.

The reference level generator in accordance with the preferred embodiment used in a nonvolatile ferroelectric memory of the present invention has various advantages. For example, a variation of a reference level can be adjusted with ease by adjusting a size of the NMOS transistors. Further, a fast response is available since the level of the reference voltage finally provided to the sense amplifier is stable without fluctuation. Moreover, the level of the final reference voltage can be maintained stable regardless of power source noise, and, if the reference voltage on the reference bitline is constant, the reference voltage is protected almost perfectly even if a noise is carried on the power source voltage.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A reference level generating circuit for a memory device comprising:
   a first amplifier and a second amplifier coupled to a reference bitline, each for comparing a reference bitline level and a fedback preliminary reference level;
   a reference level adjuster for receiving signals from the first and second amplifiers, adjusting the signals to desired reference levels, and feeding the signals back to the first and second amplifiers;
   reference level stabilizer for stabilizing a reference level from the reference level adjuster; and
   a pull-down circuit for dropping an output from the reference level stabilizer by a required level when the reference level adjustor is not adjusting the signals to desired reference levels.

2. The reference level generating circuit of claim 1, further comprising:
   an operational controller for controlling operation of the first and second amplifiers, the reference level adjuster, the reference level stabilizer, and the pull-down circuit.

3. The reference level generating circuit of claim 2, wherein the operation controller is a transistor for switching a power source voltage in response to an external first control signal.

4. The reference level generating circuit of claim 2, wherein the pull-down circuit is connected in parallel with an output terminal on the reference level stabilizer.

5. The reference level generating circuit of claim 1, wherein the first and second amplifiers compare, amplify, and forward a signal fedback from the reference voltage adjuster and a signal on the reference bitline repeatedly until an output from the reference level adjuster becomes a desired level.

6. The reference level generating circuit of claim 1, wherein each of the first and second amplifiers includes a current mirror type differential amplifier for receiving, comparing and amplifying a signal on the reference bitline and a signal fedback from the reference level stabilizer.

7. The reference level generating circuit of claim 1, wherein the first amplifier includes:
   a first transistor having a source coupled for receiving a prescribed signal, and a gate and a drain connected in common;
   a second transistor having a source for receiving the prescribed signal and a gate connected to a gate of the first transistor;
   a third transistor having a gate connected to the reference bitline and a source connected to a drain of the first transistor;
   a fourth transistor provided between a drain of the third transistor and controlled by a drain voltage of the first transistor; and
   a fifth transistor disposed between a drain of the second transistor and the first prescribed reference voltage level that is a drain of the fourth transistor, and a gate connected to an output terminal of the reference level adjuster.

8. The reference level generating circuit of claim 7, wherein the first and second transistors are PMOS transistors, and the third, fourth and fifth transistors are NMOS transistors.

9. The reference level generating circuit of claim 1, wherein the reference level adjuster includes:
   a first transistor having a first electrode coupled for receiving a prescribed signal, a second electrode coupled to an output terminal of the reference level adjustor and a gate controlled by a signal from the first amplifier;
   a second transistor controlled by a signal from the second amplifier for adjusting an output of the first transistor;
   a third transistor for switching the prescribed signal in response to a first control signal; and
   a fourth transistor controlled by a signal from the second amplifier and formed between an output terminal of the third transistor and the first amplifier.

10. The reference level generating circuit of claim 9, wherein the first and second transistors are NMOS transistors, and the third and fourth transistors are PMOS transistors.

11. The reference level generating circuit of claim 1, wherein the reference level stabilizer includes:
    first and second transistors connected to an output terminal on the reference level adjuster in series and controlled by signals from the second amplifier; and
    a third transistor having a source connected to an output terminal on the reference level adjuster and a drain connected to the output terminal on the second transistor and controlled by a control signal.

12. The reference level generating circuit of claim 11, wherein the first, second and third transistors are NMOS transistors.

13. The reference level generating circuit of claim 2, wherein the pull-down circuit includes:
    a first transistor having a drain coupled to an output terminal on the reference level stabilizer and controlled by a first control signal; and
    a second transistor formed between a source of the first transistor and a grounding terminal and having a gate and a drain connected in common.

14. The reference level generating circuit of claim 13, wherein the pull-down circuit drops an output from the reference level stabilizer to a level of a threshold voltage of a transistor in precharge.

15. The reference level generating circuit of claim 13, wherein the first and second transistors are NMOS transistors.

16. The reference level generating circuit of claim 1, wherein the second amplifier includes:
    a first transistor having a gate connected to the reference bitline, and a drain connected to the reference level stabilizer;
    a second transistor disposed between a prescribed signal and the drain of the first transistor;
    a third transistor having a gate and drain coupled together and a source coupled to the prescribed signal, wherein a gate of the second transistor is coupled to the gate of the third transistor;
    a fourth transistor formed between a source of the first transistor and a prescribed voltage terminal and having a gate connected to a gate of the third transistor; and
    a fifth transistor formed between the drain of the third transistor and a drain of the fourth transistor and having a gate connected to an output terminal on the reference level adjuster.

17. The reference level generating circuit of claim 16, wherein the second and third transistors are PMOS transistors, and the first, fourth and fifth transistors are NMOS transistors.

18. A method of generating a reference voltage comprising:

comparing a reference bitline level and a feedback preliminary reference level in first and second amplifiers in response to a switched voltage;

receiving output signals from the first and second amplifiers and adjusting the compared feedback preliminary reference level;

stabilizing the adjusted feedback preliminary reference level to generate a reference output voltage level at an approximate prescribed voltage amount greater than the reference bitline level;

reducing the reference output voltage level by a required amount, wherein the reducing is not performed concurrently with the comparing and adjusting; and controlling operation of the comparing, the adjusting, the stabilizing and the reducing with an operational controller using the switched voltage.

19. The method of generating a reference voltage of claim 18, further comprising repeating the comparing and adjusting steps until the prescribed voltage amount is reached.

20. The method of generating a reference voltage of claim 18, wherein the comparing is done by first and second amplifiers, wherein the first amplifier comprises:

a first transistor having a source coupled for receiving a prescribed signal, and a gate and a drain connected in common;

a second transistor having a source for receiving the prescribed signal and a gate connected to a gate of the first transistor;

a third transistor having a gate connected to the reference bitline and a source connected to a drain of the first transistor;

a fourth transistor provided between a drain of the third transistor and the first prescribed reference voltage level that is controlled by a gate connected to the drain of the first transistor; and a fifth transistor disposed between a drain of the second transistor and a drain of the fourth transistor, and a gate connected to an output terminal of the reference level adjuster.

21. The reference level generating circuit of claim 1, wherein the first and second amplifiers compare differential signals of the reference bitline level and the feedback preliminary reference level.

22. A reference level generating circuit for a memory device comprising:

a first amplifier and a second amplifier, each for comparing a reference bitline level and a feedback preliminary reference level;

a reference level adjuster for receiving at least one signal from each of the first and second amplifiers, adjusting the signals to desired reference levels, and feeding the feedback preliminary reference level back to the first and second amplifiers; and a reference level stabilizer for stabilizing a reference level from the reference level adjuster, and wherein the reference level adjuster comprises, a first transistor having a first electrode coupled for receiving a prescribed signal, a second electrode coupled to an output terminal of the reference level adjustor and a gate controlled by a signal from the first amplifier, a second transistor controlled by a signal from the second amplifier for adjusting an output of the first transistor, a third transistor for switching the prescribed signal in response to a first control signal, and a fourth transistor controlled by a signal from the second amplifier and formed between an output terminal of the third transistor and the first amplifier.

23. The reference level generating circuit of claim 22, wherein the reference level stabilizer includes:

fifth and sixth transistors connected to an output terminal on the reference level adjuster in series and controlled by a signal from the second amplifier; and a seventh transistor having a source connected to an output terminal on the reference level adjuster and a drain connected to an output terminal on the sixth transistor and controlled by a control signal.

24. The reference level generating circuit of claim 23, wherein the first amplifier comprises:

an eighth transistor having a first electrode coupled for receiving a prescribed signal, and a control electrode and a second electrode connected in common;

a ninth transistor having a first electrode for receiving the prescribed signal and a control electrode connected to the control electrode of the eighth transistor;

a tenth transistor having a control electrode connected to the reference bitline and a second electrode connected to the second electrode of the eighth transistor;

an eleventh transistor having a first electrode connected to the first electrode of the tenth transistor, a second electrode connected to a first prescribed reference voltage level and a control electrode connected to the second electrode of the eighth transistor; and a twelfth transistor having a second electrode connected to the second electrode of the ninth transistor, a first electrode connected to a second electrode of the eleventh transistor, and a control electrode connected to an output terminal of the reference level adjuster.

25. A reference level generating circuit for a memory device comprising:

a first amplifier and a second amplifier, each for comparing a reference bitline level and a feedback preliminary reference level;

a reference level adjuster for receiving at least one signal from each of the first and second amplifiers, adjusting the signals to desired reference levels, and feeding the feedback preliminary reference level back to the first and second amplifiers; and a reference level stabilizer for stabilizing a reference level from the reference level adjuster, and wherein the reference level stabilizer comprises, first and second transistors connected to an output terminal on the reference level adjuster in series and controlled by signals from the second amplifier, and a third transistor having a first electrode connected to the output terminal on the reference level adjuster and a second electrode connected to an output terminal on the second transistor and controlled by a control signal.

26. The reference level generating circuit of claim 25, wherein the first, second and third transistors are NMOS transistors.

* * * * *